United States Patent [19]

Hiyama

[11] Patent Number: 5,095,534
[45] Date of Patent: Mar. 10, 1992

[54] RADIO RECEIVER HAVING IMPROVED SIGNAL-TO-NOISE RATIO FOR RECEIVING VOICE AND DATA SIGNALS

[75] Inventor: Takashi Hiyama, Tokyo, Japan

[73] Assignee: NEC Corporation, Tokyo, Japan

[21] Appl. No.: 398,559

[22] Filed: Aug. 25, 1989

[30] Foreign Application Priority Data

Aug. 25, 1988 [JP] Japan .................................. 63-209492
Sep. 16, 1988 [JP] Japan .................................. 63-230136

[51] Int. Cl.$^5$ ............................................... H04B 1/06
[52] U.S. Cl. ...................................... 455/266; 455/307; 455/340
[58] Field of Search ................................. 455/33-34, 455/38, 266, 307, 296, 340, 63, 65, 339; 379/59, 63; 370/100.1; 375/5; 371/5.4, 47.1

[56] References Cited

U.S. PATENT DOCUMENTS

| | | | |
|---|---|---|---|
| 4,356,567 | 10/1982 | Eguchi et al. | 455/200 |
| 4,356,568 | 10/1982 | Ogita et al. | 455/266 |
| 4,563,651 | 1/1986 | Ohta et al. | 455/266 |
| 4,598,426 | 7/1986 | Shiojima | 455/266 |
| 4,672,657 | 6/1987 | Dershowitz | 379/63 |
| 4,907,293 | 3/1990 | Ueno | 455/296 |

Primary Examiner—Reinhard J. Eisenzopf
Assistant Examiner—Andrew Faile
Attorney, Agent, or Firm—Sughrue, Mion, Zinn, Macpeak & Seas

[57] ABSTRACT

A radio receiver having a frequency converter which frequency converts an RF signal into an IF signal. An IF filter filters the IF signal to provide the filtered output to a frequency discriminator. The discriminator frequency discriminates the filtered IF signal to produce a baseband signal. From the baseband signal, a voice signal is recovered and a data signal is extracted. Using the IF signal, a field detector detects an electromagnetic field strength of RF signal and outputs a signal detect signal when the field strength is higher than a predetermined level. A sync detector detects a sync signal in the extracted data signal and sync detect signals, a controller controls the bandwidth of IF filter so that the S/N ratio of the recovered voice signal is increased and the error rate of the extracted data signal is decreased. The signal detect signal may also be obtained by a noise detector which detects the level of a noise component extracted from the baseband signal and outputs the signal detect signal when the level of noise component is higher than the predetermined level. The frequency of the extracted noise component is positioned adjacent to the higher portion of the voice frequency band.

28 Claims, 4 Drawing Sheets

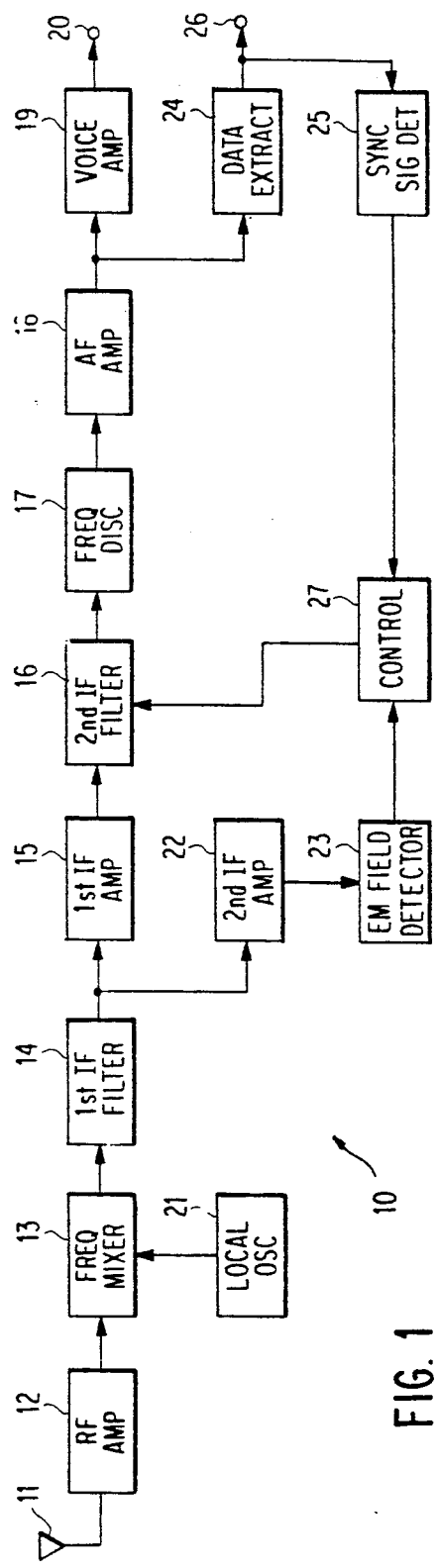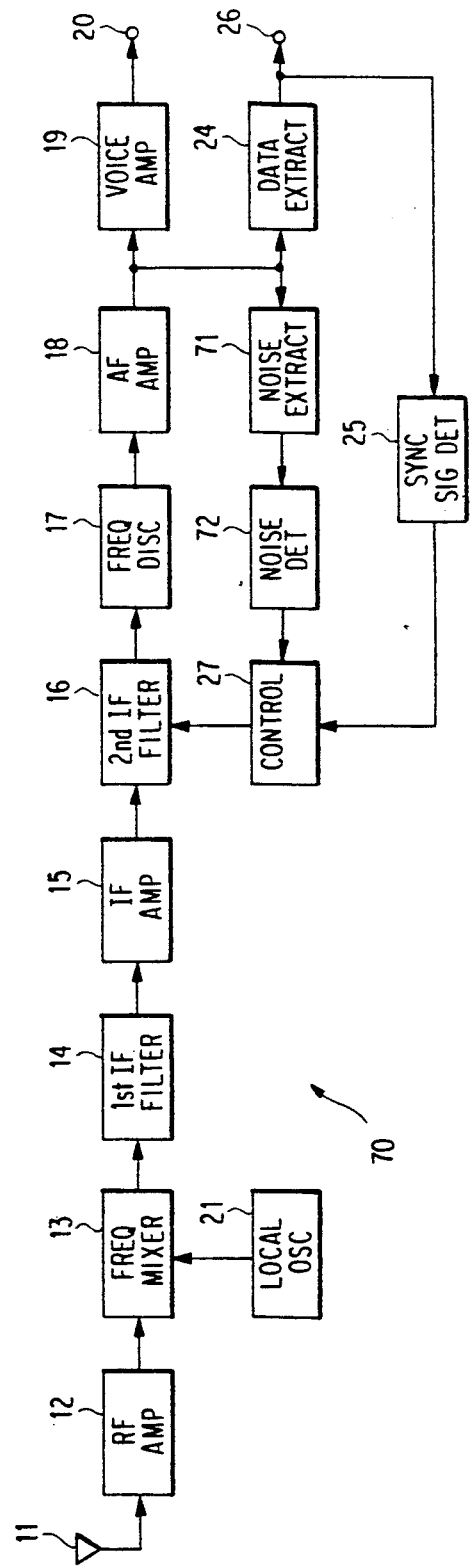

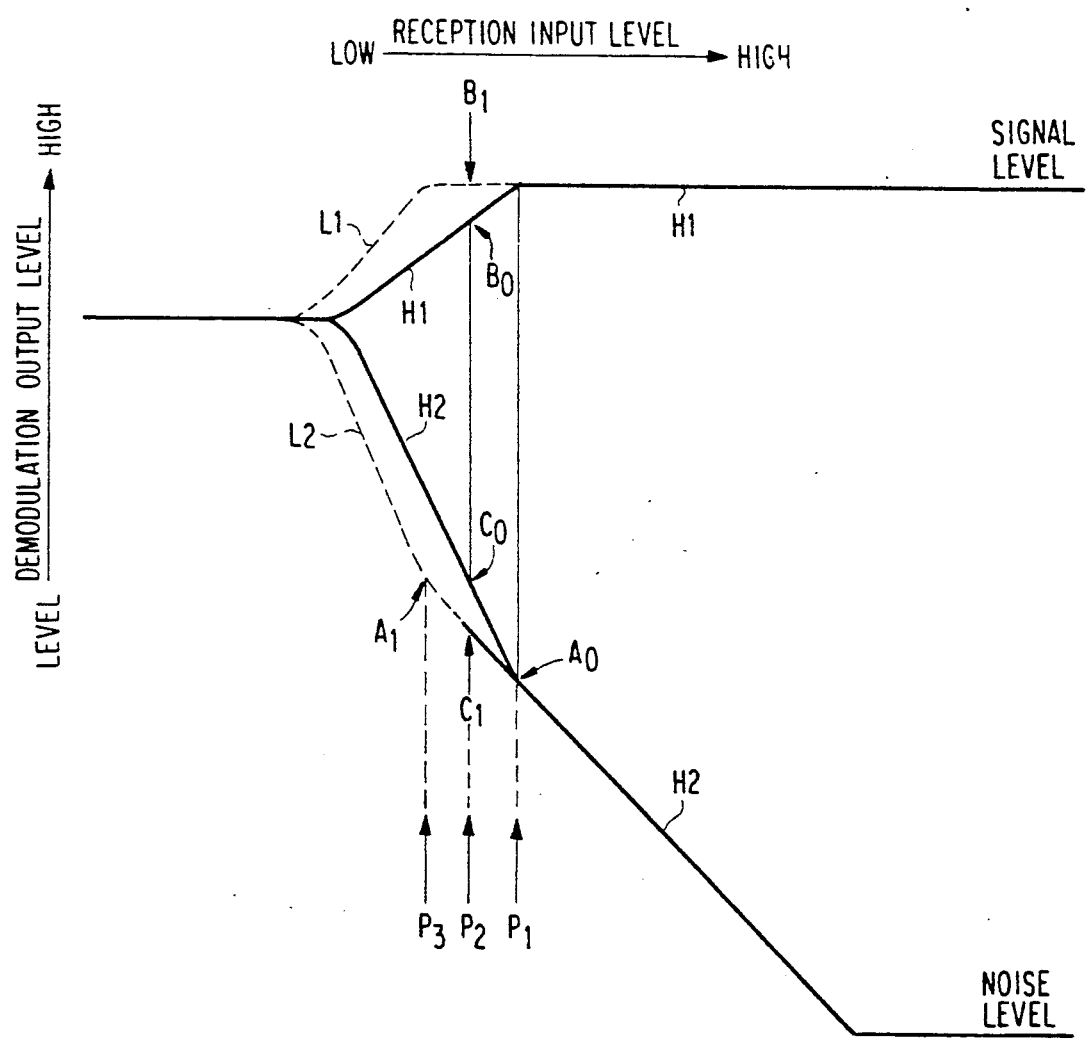

RADIO RECEIVER HAVING IMPROVED SIGNAL-TO-NOISE RATIO FOR RECEIVING VOICE AND DATA SIGNALS

BACKGROUND OF THE INVENTION

The present invention relates to a radio receiver and, more particularly, to a radio receiver receiving both a voice and a data signal.

If a radio receiver receives a radio signal having a relatively low level, the receiver produces a demodulated baseband signal with an impaired signal-to-noise (S/N) ratio. To improve the S/N ratio, several ways may be employed. An example for a satellite broadcasting receiver is disclosed in Japanese Patent Application Publication (Kokai) 63-39291 (39291/1988). The disclosed broadcasting receiver includes a frequency-modulation (FM) demodulator having a phase-locked loop (PLL) circuit and a receiving condition decision circuit. In response to the output of the receiving condition decision circuit, a controller controls the bandwidth of a loop filter within the PLL circuit to obtain an optimized video signal.

Since the broadcasting receiver includes the PLL circuit, it is difficult to broaden the receiving bandwidth which is restricted by the response characteristics of the PLL circuit. Also, the PLL circuit inherently has a problem of out-of lock. Since linear amplification is required prior to the PLL circuit to improve the S/N ratio, the broadcasting receiver is not suitable for a mobile communications system in which an input to a demodulator, namely, a frequency discriminator must be amplitude limited to depress amplitude fluctuations in the received signal.

SUMMARY OF THE INVENTION

An object of the present invention is, therefore, to provide a generally improved radio receiver which eliminates the foregoing problems.

Another object of the present invention is to provide a radio receiver that has a relatively wide receiving bandwidth.

Still another object of the present invention is to provide a radio receiver which receives both voice and data signals, the frequency band of the data signal being adjacent to the lower part of the voice frequency band.

Still yet another object of the present invention is to provide a radio receiver capable of producing a voice signal having a high S/N ratio and a data signal having a low error rate.

Another object of the present invention is to provide a radio receiver suitable for a mobile communications system.

According to the present invention, there is provided a radio receiver having a frequency converter which frequency converts a radio frequency (RF) signal into an intermediate frequency (IF) signal. An IF filter filters the IF signal to provide the filtered output to a frequency descriminator. The discriminator frequency discriminates the filtered IF signal to produce a baseband signal. From the baseband signal, a voice signal is recovered and a data signal is extracted. Using the IF signal, a field detector detects the electromagnetic field strength of the RF signal and outputs a signal detect signal when the field strength is higher than a predetermined level. A sync detector detects a sync signal from the extracted data signal to produce a sync detect signal. In response to the signal and sync detect signals, a controller controls the bandwidth of the IF filter so that the S/N ratio of the recovered voice signal is increased and the error rate of the extracted data signal is decreased.

The signal detect may also be obtained by a noise detector which detects a level of a noise component extracted from the baseband signal and outputs the signal detect signal when the level of noise component is higher than the predetermined level. The frequency of the extracted noise component is positioned adjacent to the higher portion of the voice frequency band.

BRIEF DESCRIPTION OF THE DRAWINGS

The above and other objects, features and advantages of the present invention will become more apparent from the following description referring to the accompanying drawings, in which:

FIG. 1 is a block diagram showing a radio receiver in accordance with an embodiment of the present invention;

FIG. 2 shows a graph of S/N characteristics of a receiver for explaining the present invention;

FIG. 6 is a block diagram showing a radio receiver in accordance with yet another embodiment of the present invention.

DETAILED DESCRIPTION OF THE PREFERRED EMBODIMENTS

Figure 3A:
FIGS. 3A, 3B and 3C are time charts showing the operation of the FIG. 1 receiver.

In FIG. 1, a radio receiver 10 includes an antenna 11 picking up a radio frequency (RF) signal and supplies it to an RF amplifier 12. The amplifier 12 amplifies the RF signal and supplies the amplified RF signal to a frequency converter, or mixer, 13. The frequency mixer 13 also receives a local oscillation signal from a local oscillator 21 and frequency mixes the amplified RF signal and the local oscillation signal to produce an intermediate frequency (IF) signal. A first IF filter 14 filters the IF signal to eliminate undesired components therein. A first IF amplifier 15 amplifies the filtered IF signal and supplies the amplified IF signal to a second IF filter 16 whose bandwidth is changeable in accordance with a control signal from a controller 27, as described in detail later.

The second IF filter 16 provides the filtered IF signal to a frequency discriminator 17 which demodulates, or frequency discriminates, the IF signal to produce a baseband, or audio frequency (AF), signal. An AF amplifier 18 amplifies the AF signal and provides the amplified AF signal to a voice amplifier 19 and a data extractor 24. The voice amplifier 19 amplifies the AF signal and outputs the amplified AF signal to a voice output terminal 20 to which a speaker may be connected to recover a voice signal. The data extractor 24 extracts a data signal out of the AF signal and outputs the extracted data signal to a data terminal 26 to which auxiliary equipment, such as a printer, may be connected. The frequency band of the extracted data signal is allotted to a space just below the frequency band of the voice signal.

If the receiver 10 receives an RF signal whose level is lower than the so-called threshold level, the S/N ratio of the demodulated signal is extremely deteriorated. On the other hand, if the level of RF signal is higher than the threshold level, the S/N ratio is markedly improved, which is known as the threshold effect in the art. The threshold level is determined by the bandwidth of the IF filter and lowered by narrowing the same. Thus, the S/N ratio for the lower level RF signal can be improved by narrowing the IF bandwidth, i.e., lowering the threshold level. This can further be explained as follows. When the received RF signal level is around the threshold level, the thermal noise plays a significant role in the S/N ratio while the distortion noise caused by the IF filter has a smaller effect on the S/N ratio. When the RF signal level is higher than the threshold level, however, the distortion noise affects the S/N ratio much more than does the thermal noise.

Referring briefly to FIG. 2, solid lines H1 and H2 indicate signal and noise levels, respectively, when the receiver 10 has a threshold level P1. Broken lines L1 and L2 indicate signal and noise levels, respectively, when the receiver 10 has a threshold level P3. When the receiver 10 has the threshold level P1 and and RF signal has a level P2, the S/N ratio becomes B0/C0. When the receiver 10 has the threshold level P3 and and RF signal has the same level P2, the S/N ratio becomes B1/C1. The S/N ratio B1/C1 is obviously higher than the S/N ratio B0/C0. Thus, by lowering the threshold level, i.e., narrowing the IF bandwidth, the S/N ratio can be improved.

As mentioned earlier, however, if the IF bandwidth is narrowed too much, the distortion noise contributes to the deterioration in the S/N ratio. According to the present invention, therefore, when the RF signal level is decreased to be lower than a predetermined level (e.g., the threshold level P1), the IF bandwidth is narrowed so that the threshold level becomes the level P3. When the RF signal level is increased to be higher than the predetermined level (P1), the IF bandwidth is widened so that the threshold level returns to the level P1.

Returning to FIG. 1, the output of first IF filter 14 is also applied to a second IF amplifier 22 which amplifies the applied IF signal and supplies the amplified IF signal to an electromagnetic field detector 23. The detector 23 detects the field strength of the IF signal which is proportional to that of the received RF signal. When the field strength is higher than a predetermined level, for example, the foregoing threshold level, the detector 23 produces a high-level signal. Otherwise, the detector 23 produces a low-level signal (see FIG. 3B). The high- and low-level signals are provided to the controller 27. The field detector 23 may include an envelope detector and a voltage comparator. An integration circuit may further be connected to the output of the voltage comparator to increase the detection reliability.

Figure 3B:
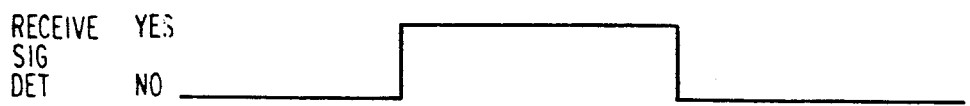

The data output of data extractor 24 is also applied to a sync signal detector 25 which detects a sync pattern, or signal, out of the extracted data to produce a high-level signal and otherwise to produce a low-level signal, as shown in FIG. 3A. The output of sync signal detector 25 is applied to the controller 27. The sync signal detector 25 may be composed of a pattern matching circuit which compares a sync pattern stored therein with the extracted data and outputs a sync detect signal if they coincide. A counter may also be connected to the output of the pattern matching circuit to increase the reliability of the sync signal detection.

Figure 3C:
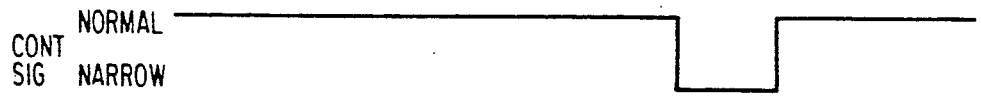

In response to the outputs of field detector 23 and sync signal detector 25, the controller 27 provides the second IF filter 16 with a control signal shown in FIG. 3C. More specifically, when the sync signal detector output is high and the field detector output is low, the controller 27 provides a low-level signal to the second IF filter 16 to cause the bandwidth thereof to be narrowed. Otherwise, the controller 27 provides a high-level signal to the IF filter 16 to cause the bandwidth to be widened, or be normal.

The receiver 10 includes no PLL circuit and, thus, it has a relatively wide receiving bandwidth and no problem of out-of lock arises. Since a limiter amplifier may be inserted prior to the frequency discriminator 17, the receiver 10 is suitable for a mobile communications system in which fluctuations are found in the received RF signal. The limiter amplifier suppresses the fluctuations. Furthermore, by controlling the bandwidth of the IF filter as discussed above, the S/N ratio of the voice signal can be increased while the error rate of data signal can be decreased.

Figure 4:
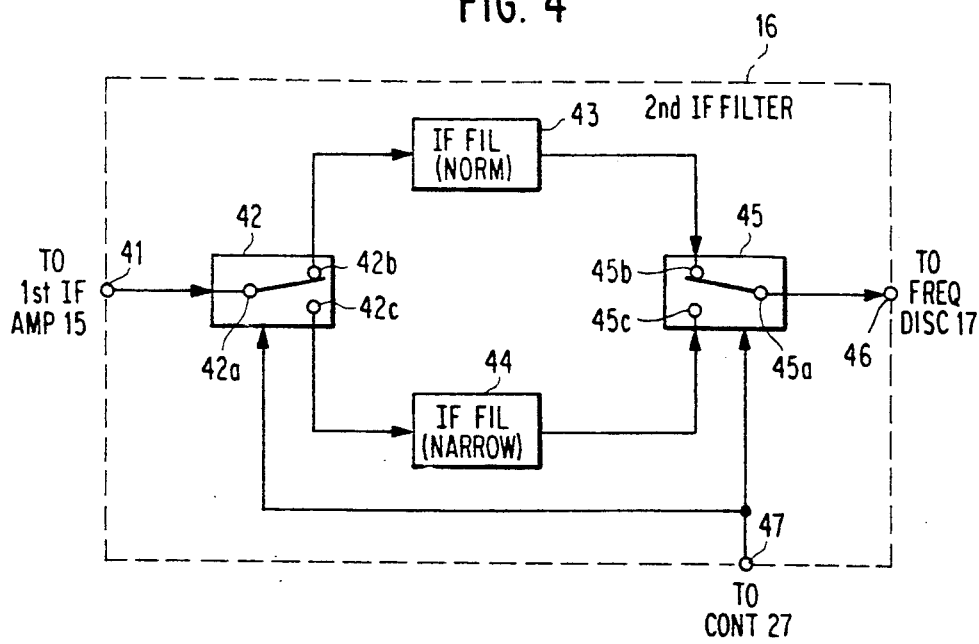
FIG. 4 is a schematic block diagram showing a specific circuit structure of a second IF filter in the FIG. 1 receiver.

In FIG. 4, the variable IF filter 16 changes its bandwidth in response to a control signal provided from the controller 27 through a terminal 47. When the control signal is high, switch circuits 42 and 45 connect terminals 42a and 45a to terminals 42b and 45b, respectively. Thus, the output of first IF amplifier 15 is applied to an IF filter 43 having a normal bandwidth through a terminal 41 and switch 42. The output of normal-band IF filter 43 is supplied to the frequency discriminator 17 through the switch 45 and a terminal 46. On the other hand, when the control signal is low, the switch circuits 42 and 45 connect the terminals 42a and 45a to terminals 42c and 45c, respectively. Thus, the output of first IF amplifier 15 passes through an IF filter 44 having a narrow bandwidth to reach the frequency discriminator 17. The IF filter 16 of FIG. 4 is adapted for a receiver having a relatively high IF frequency.

Figure 5:
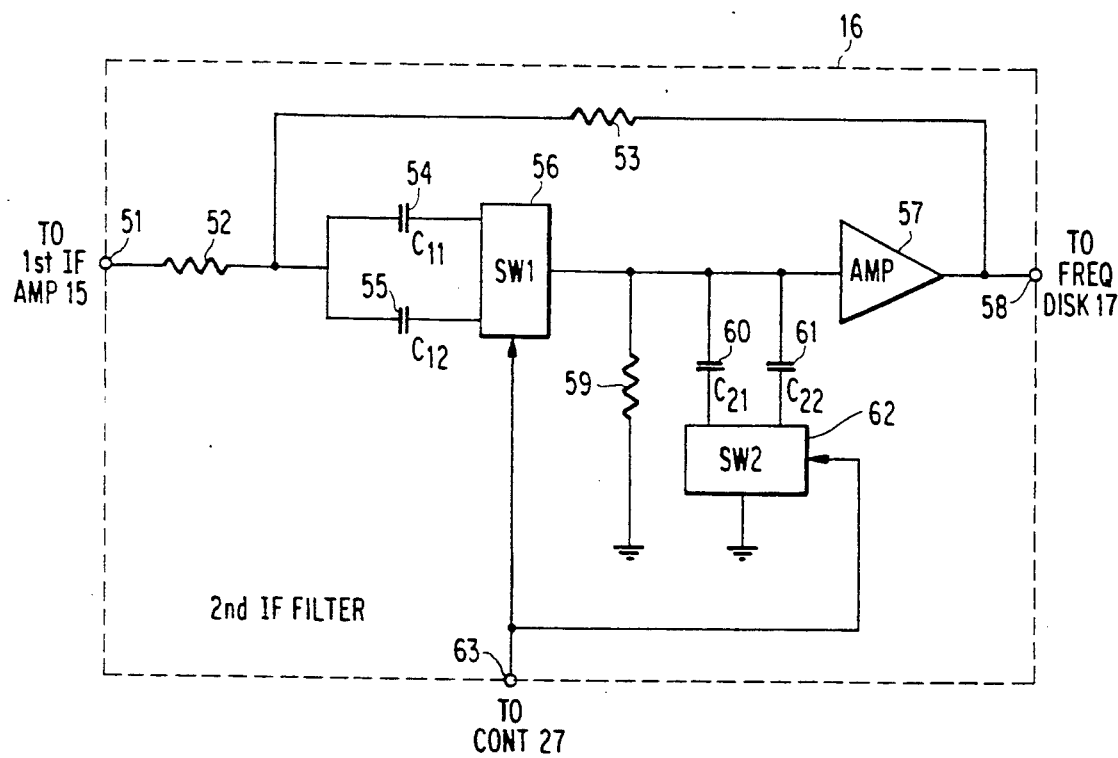
FIG. 5 is a schematic circuit diagram showing another specific circuit structure of a second IF filter in the FIG. 1 receiver.

In FIG. 5, the IF filter 16 is an active filter adapted for a relatively low IF frequency. The filter includes a resistor 52 one end of which is connected to the output of the first IF amplifier 15. The filter also includes an amplifier 57, an output of which is connected to the input of the discriminator 17. A resistor 53 is connected between the other end of the resistor 52 and the output of the amplifier 57. Each of the capacitors 54 and 55 is connected at its one end to the other end of resistor 52. A switch 56 selectively connects the other ends of capacitors 54 and 55 to the input of amplifier 57 in response to the high and low level control signals, respectively. Each of capacitors 60 and 61 is connected at its one end to the input of amplifier 57. A switch 62 selectively connects the other ends of capacitors 60 and 61 to ground in response the high and low level control signals, respectively. In other words, the filter 162 changes its bandwidth in response to a control signal provided from the controller 27 through a terminal 63. When the control signal is high, the switch 56 connects the capacitor 54 to an input of an amplifier 57 and the switch 62 connects the capacitor 60 to ground. When the control signal is low, the switches 56 and 62 connect the capacitor 55 to the amplifier 57 input and the capacitor 61 to ground, respectively. A bandwidth of the filter 16 can be changed without changing its center frequency, provided that $C11 \cdot C21 = C12 \cdot C22$ where C11, C12, C21, and C22 are capacitances of the capacitors 54, 55, 60 and 61, respectively. The output of first IF amplifier 15 is applied to the amplifier 57 through a terminal 51, an input resistor 52, either the capacitor 54 or 55 and the switch 56. The output of amplifier 57 is applied to the frequency discriminator 17 through a terminal 58. A feedback resistor 53 is connected between the output of amplifier 57 and an end of resistor 52. A resistor 59 is connected between the input of amplifier 57 and ground.

In FIG. 6, the same numerals as those in FIG. 1 denote the same elements as those in FIG. 1. Thus, no further description about those elements will be provided. The output of AF amplifier 18 is applied to a noise extractor 71 as well as the voice amplifier 19 and the data extractor 24. The noise extractor 71 extracts from the baseband signal a noise component whose frequency is adjacent to the higher portion of the voice frequency band. The extracted component is applied to a noise detector 72 which outputs a high-level signal when the level of the noise component exceeds a predetermined level and otherwise outputs a low-level signal. The high-level signal indicates that a received RF signal has a level above a predetermined level, e.g., the threshold level. The low-level signal indicates the opposite. Thus, the noise extractor and detector 71 and 72 have the same function as the second IF amplifier 22 and the field detector 23 in FIG. 1.

What is claimed is:

1. A receiver comprising:
   receiver means for receiving a radio frequency (RF) signal to produce a received RF signal;
   frequency converter means for frequency converting said received RF signal into an intermediate frequency (IF) signal;
   variable fitler means for extracting said IF signal from the output of said frequency converter means;
   demodulator means for demodulating the output of said filter means to produce a demodulated signal;
   sync detector means for detecting a sync signal in said demodulated signal to produce a sync detection signal;
   field detector means for detecting an electromagnetic field strength of said received RF signal to produce a field detection signal; and
   control means responsive to said sync and field detection signals for controlling the bandwidth of said variable filter means.

2. A receiver as claimed in claim 1, wherein said field detector means comprises:
   means for producing a first signal when said field strength is higher than a predetermined level; and
   means for producing a second signal when said field strength is lower than said predetermined level, and
   wherein said control means comprises:
   means responsive to a combination of said first signal and said sync signal for providing a first control signal to said variable filter means to provide a wide bandwidth therefor; and
   means responsvie to said second signal and said sync detect signal for providing a second control signal to said variable filter means to provide a narrow bandwidth therefor.

3. A receiver as claimed in claim 2, wherein said variable filter means comprises:
   a first filter having a first bandwidth;
   a second filter having a second bandwidth narrower than said first bandwidth;
   first switch means for connecting the output of said frequency converter means to said first and second filters in response to said first and second control signals, respectively; and
   second switch means for connecting the outputs of said first and second filters to the input of said demodulator means in response to said first and second control signals, respectively.

4. A receiver as claimed in claim 2, wherein said variable filter means comprises:
   a frist resistor one end of which is connected to the output of said frequency converter means;
   an amplifier an output of which is connected to the input of said demodulator means;
   a second resistor connected between the other end of said first resistor and the output of said amplifier;
   first and second capacitors one end of each being connected to said other end of said first resistor;
   first switch means for selectively connecting the other end of each said first and second capacitors to the input of said amplifier in response to said first and second control signals, respectively;
   a third resistor connected between the input of said amplifier and ground;
   third and fourth capacitors one end of each being connected to the input of said amplifier; and
   second switch means for selectively connecting the other end of each said third and fourth capacitors to ground in response to said first and second control signals, respectively.

5. A receiver comprising:
   means for receiving an RF signal to produce a received RF signal;
   frequency converter means for frequency converting said received RF signal into an IF signal;
   filter means for filtering the output of said frequency converter means to extract said IF signal therefrom;
   demodulator means for demodulating the output of said filter means to produce a baseband signal;
   frist detector means for detecting a specific signal out of said baseband signal to produce a first detect signal;
   second detector means responsive to the output of said frequency converter means for detecting whether a received level of said RF signal is higher than a predetermined level and for producing a second detect signal when said received level is higher than said predetermined level; and
   control means responsive to said first and second detect signals for controlling the bandwidth of said filter means.

6. A receiver as claimed in claim 5, wherein said control means comprises first means for narrowing said bandwidth in response to a first combination of said first detect signal and said second detect signal; and second means for causing the bandwidth of said filter means to be normal in response to a second combination of said first and second detect signals.

7. A receiver as claimed in claim 6, wherein said second detector means comprises:
   means responsive to the output of said frequency converter means for detecting electromagnetic field strength of said receiver RF signal and for producing said second detect signal when said strength is higher than said predetermined level.

8. A receiver as claimed in claim 6, wherein said second detector means comprises:
   noise extractor means for extracting from said baseband signal a noise component; and noise detector means for producing said second detect signal when the level of said noise component is higher than said predetermined level.

9. A receiver as claimed in claim 8, further comprising:
voice recovery means for recovering a voice signal out of said baseband signal, the frequency of said noise component being adjacent to the upper part of the frequency band of said noise signal; and
data extractor means for extracting a data signal out of said baseband signal, the frequency band of said data signal being lower than said frequency band of said voice signal.

10. A receiver as claimed in claim 5, wherein said predetermined level is a threshold level of said receiver.

11. A receiver as claimed in claim 5, wherein said demodulator means comprises means for frequency discriminating the output of said filter means to produce said baseband signal.

12. A receiver as claimed in claim 5, further comprising another filter means for filtering the output of said frequency converter means;
first amplifier means for amplifying the output of said another filter means to produce the output thereof to said filter means; and
second amplifier means for amplifying the output of said demodulator means.

13. A receiver as claimed in claim 5, wherein said frequency converter means comprises:
means for locally generating an oscillation signal; and
means for frequency mixing the output of said receiving means and said oscillation signal to produce said IF signal.

14. A receiver as claimed in claim 6, wherein said filter means comprises:
a first filter having a first bandwidth;
a second filter having a second bandwidth narrower than said first bandwidth;
switch means for connecting said first filter between the output of said frequency converter means and the input of said demodulator means in response to said second combination and for connecting said second filter between the output of said frequency converter means and the input of said demodulator means in response to said first combination.

15. A receiver as claimed in claim 6, wherein said filter means comprises an active filter.

16. A receiver as claimed in claim 15, wherein said active filter comrpises:
a first resistor one end of which is connected to the output of said frequency converter means;
an amplifier an output of which is connected to the input of said demodulator means;
a second resistor connected between the other end of said first resistor and the output of said amplifier;
first and second capacitors one end of each being connected to said other end of said first resistor;
first switch means for selectively connecting the other end of each said first and second capacitors to the input of said amplifier in response to said first and second control signals, respectively;
a third resistor connected between the input of said amplifier and ground;
third and fourth capacitors one end of each being connected to the input of said amplifier; and
second switch means for selectively connecting the other end of each said third and fourth capacitors to ground in response to said first and second control signals, respectively.

17. A radio receiver comprising:
frequency converter means for frequency converting a radio frequency (RF) signal into an intermediate frequency (IF) signal;
filter means for filtering said IF signal to produce a filtered IF signal;
demodulator means for demodulating said filtered IF signal to produce a baseband signal;
first detector means for detecting a sync signal from said baseband signal to produce a first sync detect signal;
second detector means responsive to said filtered IF signal for detecting an RF signal whose level is higher than a predetermined level, to produce a second detect signal;
means for narrowing the bandwidth of said filter means in response to a first combination of said first detect signal and absence of said second detect signal.

18. A radio receiver as claimed in claim 17, further comprising means for causing the bandwidth of said filter means to be normal in response to a second combination of said first and second detect signals.

19. A radio receiver as claimed in claim 17, wherein said second detector means comprises:
means responsive to the output of said frequency converter means for detecting electromagnetic field strength of said receiver RF signal and for producing said second detect signal when said strength is higher than said predetermined level.

20. A receiver as claimed in claim 17, wherein said second detector means comprises:
noise extractor means for extracting from said baseband signal a noise component; and
noise detector means for producing said second detect signal when the level of said noise component is higher than said predetermined level.

21. A receiver as claimed in claim 17, wherein said demodulator means comprises means for frequency discriminating the output of said filter means to produce said baseband signal.

22. A method of controlling a bandwidth of an intermediate frequency (IF) filter within a radio receiver, comprising the following steps of:
receiving a radio frequency (RF) signal to produce a received RF signal;
frequency converting said received RF signal into an IF signal;
filtering said IF signal to produce a filtered IF signal;
demodulating said filtered IF signal to produce a baseband signal;
detecting a specific signal out of said baseband signal to produce a first detect signal;
responsive to said IF signal, detecting an RF signal whose level is higher than a predetermined level to produce a second detect signal; and
responsive to said first and second detect signals, controlling said bandwidth.

23. A method as claimed in claim 22, wherein said step of controlling said bandwidth comprises the steps of:
narrowing said bandwidth in response to a first combination of said first detect signal and absence of said second detect signal; and
widening said bandwidth in response to other combinations of said first and second detect signals.

24. A method as claimed in claim 22, wherein said stop of detecting an RF signal comprises the steps of detecting electromagnetic field strength of said received RF signal in response to said IF signal; and producing said second detect signal when said strength is higher than said predetermined level.

25. A method as claimed in claim 22, wherein said step of detecting an RF signal comprises the steps of:
   extracting from said baseband signal a noise component; and
   producing said second detect signal when the level of said noise component is higher than said predetermined level.

26. A method as claimed in claim 22, further comprising the steps of:
   recovering a voice signal out of said baseband signal; and
   extracting a data signal out of said baseband signal, the frequency band of said data signal being lower than the frequency band of said voice signal.

27. A method as claimed in claim 22, wherein said predetermined level is a threshold level of said radio receiver.

28. A method as claimed in claim 22, wherein said step of demodulating comprises the step of frequency discriminating said filtered IF signal to produce said baseband signal.

* * * * *